(12) United States Patent  (10) Patent No.: US 7,728,604 B1
Simmons et al.  (45) Date of Patent: Jun. 1, 2010

(54) TESTING DIFFERENTIAL SIGNAL STANDARDS USING DEVICE UNDER TEST'S BUILT IN RESISTORS

(75) Inventors: Tuyet Ngoc Simmons, Monte Sereno, CA (US); Brian Sadler, San Jose, CA (US); Michael Leonard Simmons, Monte Sereno, CA (US); Andrew W. Lai, Fremont, CA (US)

(73) Assignee: XILINX, Inc., San Jose, CA (US)

( * ) Notice: Subject to any disclaimer, the term of this patent is extended or adjusted under 35 U.S.C. 154(b) by 247 days.

(21) Appl. No.: 12/029,430

(22) Filed: Feb. 11, 2008

(51) Int. Cl.
*G01R 31/02* (2006.01)
*G01R 31/14* (2006.01)

(52) U.S. Cl. .................. 324/537; 324/763; 702/117
(58) Field of Classification Search ............... 324/537, 324/500, 527, 523, 763, 765, 76.11; 702/120, 702/118, 117, 108
See application file for complete search history.

(56) References Cited

U.S. PATENT DOCUMENTS

| | | | |
|---|---|---|---|
| 6,182,163 B1 * | 1/2001 | Yamashita et al. ............ 710/12 |
| 6,777,946 B2 * | 8/2004 | Ott ............................. 324/434 |
| 6,847,203 B1 * | 1/2005 | Conti et al. ............... 324/158.1 |
| 6,876,218 B1 * | 4/2005 | Simmons et al. ............. 324/763 |
| 6,931,344 B2 * | 8/2005 | Gotoh et al. ................. 702/117 |

* cited by examiner

*Primary Examiner*—Hoai-An D Nguyen
(74) *Attorney, Agent, or Firm*—Thomas A. Ward (57) ABSTRACT

A test setup is provided to test differential signals outputs from the I/O block (IOB) pairs in an integrated circuit (IC). The test setup allows elimination of the external 100 Ohm resistors provided across the differential outputs on a device under test (DUT) test board containing the IC by taking advantage of a 100 Ohm resistor built into the IC between a portion of the IOB pairs. An IOB pair being tested may have its differential output terminal pair shorted to the differential output terminal pair of the IOBs having the internal 100 Ohm resistor.

16 Claims, 6 Drawing Sheets

FIG. 1

(Prior Art)

TESTING DIFFERENTIAL SIGNAL STANDARDS USING DEVICE UNDER TEST'S BUILT IN RESISTORS

BACKGROUND

1. Technical Field

Embodiments of the present invention relates to a 100 Ohm resistor used between two Input/Output (I/O) Block (IOB) output differential pair terminals for differential signal testing of the output terminals of the IOBs in an integrated circuit device.

2. Related Art

Testing differential signal standards typically requires placing a 100 Ohm resistor on a device under test (DUT) board containing a chip for each differential I/O pair. With complex chips, such as programmable logic devices (PLDs) including complex programmable logic devices (CPLDs) and field programmable gate arrays (FPGAs), microprocessors or other circuits, the chip can have 500 or more pin pairs. With 500 pin pairs, 500 resistors must be added to a DUT test board. This makes the DUT board expensive, difficult to manufacture, and increases its size. In addition, the extra components increase the amount of maintenance required to keep the DUT board ready for use in manufacturing.

Figure 1:
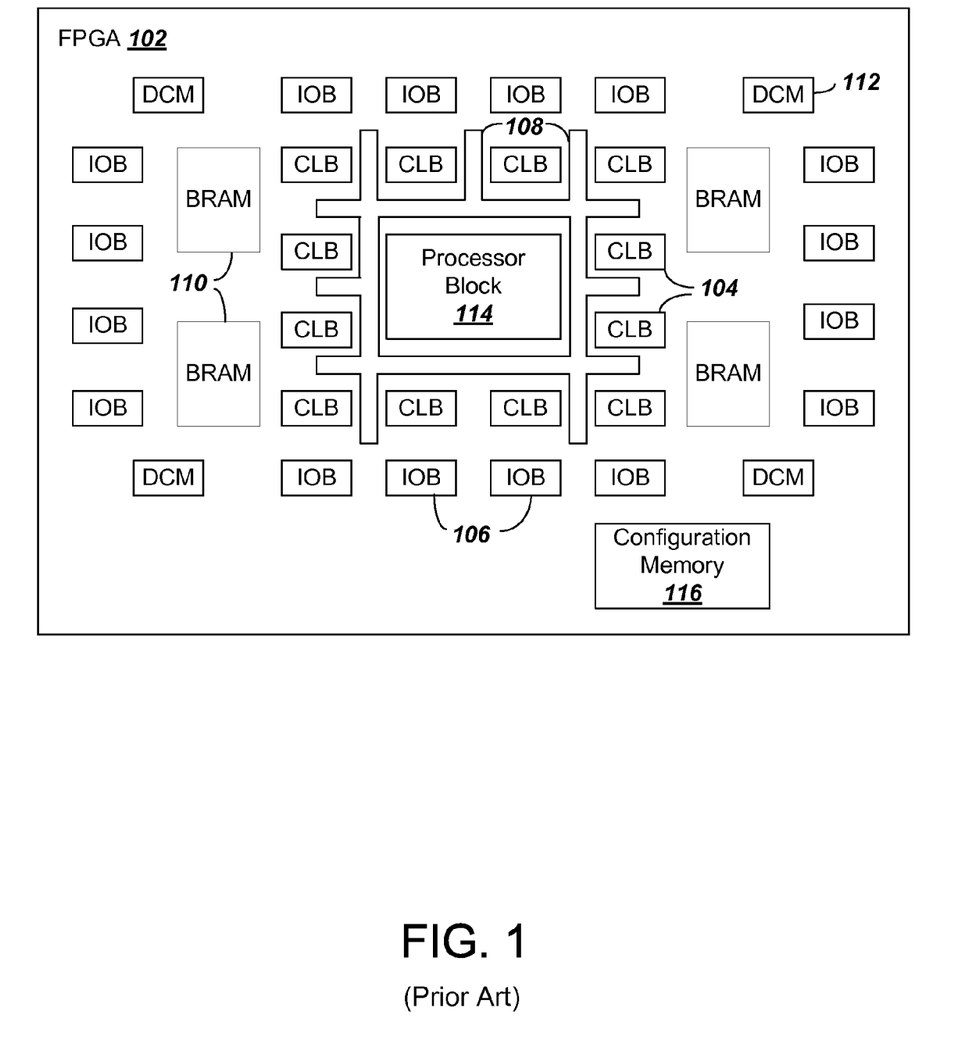
FIG. 1 is a block diagram depicting typical components of an FPGA.

For reference, FIG. 1 shows typical components found on an FPGA. Although an FPGA is shown, it is understood that similar chips with differential I/Os may be used with embodiments of the present invention. The FPGA shown includes programmable or configurable logic blocks (CLBs) 104, input/output blocks (IOBs) 106, and programmable interconnects 108, as well as configuration memory 116 for determining the functionality of the FPGA 102. The FPGA 102 may also include an embedded processor block 114, as well as various other dedicated circuitry such as blocks of random access memory ("BRAM 110"), and digital clock managers (DCM) blocks 112. Those skilled in the art will appreciate that the FPGA 102 may include other types of logic blocks and circuits in addition to those described herein.

The IOBs 106, the CLBs 104, and the programmable interconnect 108 may be configured to perform a variety of functions. The CLBs 104 are programmably connectable to each other, and to the IOBs 106, via the programmable interconnect 108. Each CLB slice in turn includes various circuits, such as flip-flops, function generators (e.g., look-up tables (LUTs)), logic gates, and memory. The IOBs 106 are configured to link signals from the pins on the chip to and from the CLBs 104, or to and from other IOBs. A pair of IOBs can provide a differential output over a pair of terminals connected to pads that are wire bonded to pins of a chip. The IOBs 106 can also include transceiver circuitry configured for communication between a connection pad and a variety of media, such as wired, wireless, optical, and photonic, whether analog or digital. Configuration information for the CLBs 104, the IOBs 106, and the programmable interconnect 108 is stored in the configuration memory 116. The configuration memory 116 may include static random access memory (SRAM) cells. The DCM blocks 112 provide well-known clock management circuits for managing clock signals within the FPGA 102, such as delay lock loop (DLL) circuits and multiply/divide/de-skew clock circuits. The processor block 114 includes a microprocessor core, as well as associated control logic.

Figure 2:
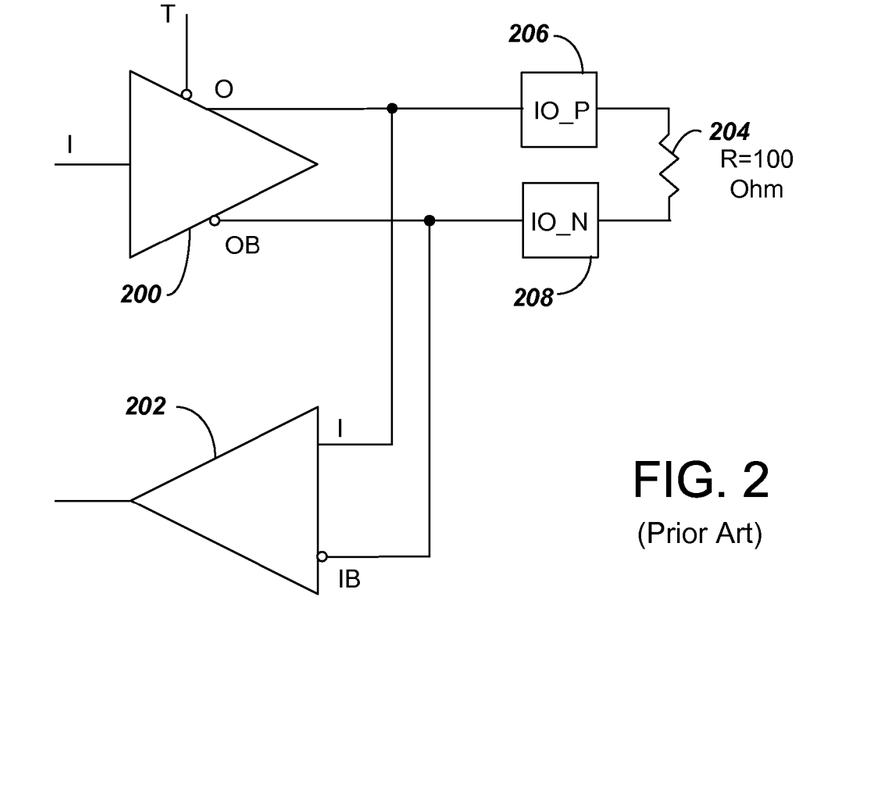
FIG. 2 shows a conventional test configuration for differential testing of the outputs of IOBs using a 100 Ohm external resistors.

FIG. 2 illustrates the conventional external resistor method of differential testing of an IOB pair. The differential output buffer 200 receives an input signal (I) from components internal to the integrated circuit, such as a CLB, or from another IOB. The IOBs provide a first signal (O) 206 and a second signal (OB) 208 complementary to the first. The IOB pair 206 and 208 are labeled IO_P and IO_N, respectively, to represent P type and N type differential output contacts, and may be connection points to pins of a chip connected to the buffer 200. An input buffer 202 likewise receives a differential input from terminals 206 and 208. The differential input includes a first signal (I) and a second signal (IB) complementary to the first.

A 100 Ohm resistor 204 is provided across the terminals 206 and 208 to accommodate differential testing standards. The 100 Ohm resistor 204 is provided on a test board separate from a chip containing the buffers 200 and 202. The differential test standards that use the resistor 204 include for example, low-voltage differential signaling (LVDS) standard, output differential voltage, (VOD), and output common mode (VOCM.) The current test methods require a 100 Ohm resistor for each differential I/O pair.

During testing, the input signal (I) is applied to the output buffer 200. Differential output signals (O) and (OB) are measured from the terminals 206 and 208. When a logic 1 is applied to input (I), the outputs (O) and (OB) are expected to be a high and a low respectively. When a logic 0 is applied to input I, outputs (O) and (OB) are expected to provide a low and a high respectively.

Figure 3:
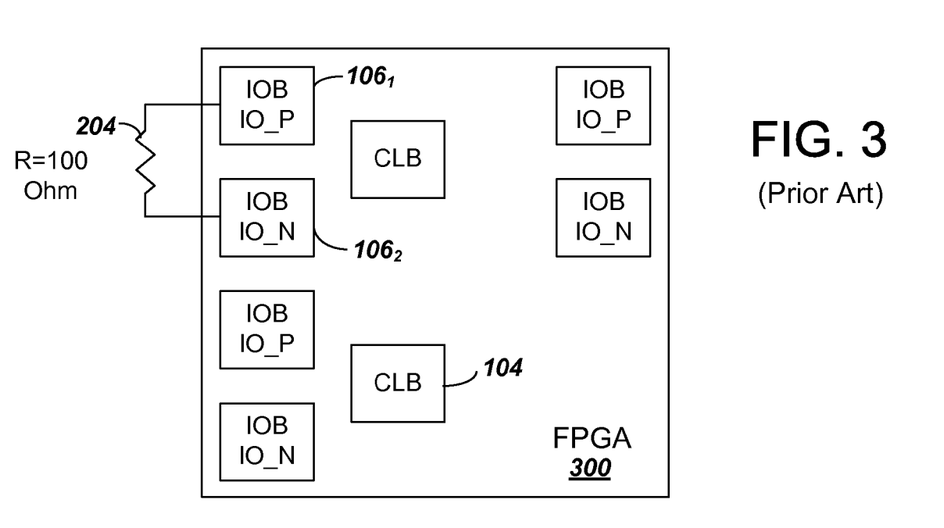
FIG. 3 shows a block diagram of components of an FPGA illustrating how an external 100 Ohm resistor is connected for differential testing.

FIG. 3 shows a block diagram of components of an FPGA 300 illustrating how an external 100 Ohm resistor is connected for differential testing. As shown, the resistor 204 is connected across two IOBs $106_1$ and $106_2$. The IOB $106_1$ provides the IO_P differential output, while the IOB $106_2$ provides the IO_N differential output. A CLB, such as 104 can be connected in the FPGA 300 by internal routing lines to provide the differential signal to the IOBs $106_1$ and $106_2$. Although only one resistor 204 is shown, other resistors will be required on a printed circuit test board where the FPGA 300 is mounted to test the differential outputs IOBs other than the differential output provided by IOBs $106_1$ and $106_2$.

It is desirable to provide further test configurations that allow testing differential signal standards without requiring a large number of resistors on a DUT test board.

SUMMARY

According to embodiments of the present invention, a test setup is provided to test differential signals standards that do not require external 100 Ohm resistors on a DUT test board across the IOB differential outputs by taking advantage of built-in or internal 100 Ohm resistors.

According to embodiments of the present invention, the 100 Ohm resistor across an IOB pair is used during testing by connecting its internal resistor across the differential IOB pair being tested. In one embodiment, some IOB pairs in the system are provided with a differential termination (DT) that includes a built in 100 Ohm resistor. Thus, the DT IOB pair in the system is the IOB pair with terminals shorted to differential terminals of the IOB pair being tested.

In some embodiments, entire columns of IOBs can be tested at one time. To test an entire column, a second column of IOB pairs with internal resistors have differential outputs shorted to the differential outputs of IOB pairs in the column to be tested. In this manner, the 100 Ohm resistors in the second column take the place of 100 Ohm resistors normally mounted externally on the DUT test board for each IOB pair in the column being tested.

In an alternative embodiment, one column of IOBs is tested by sequentially connecting the differential output of one IOB pair at a time to an IOB pair with an internal resistor. In this embodiment, registers are connected to form a shift register to apply tri-state signals to buffers providing differential output signals driving the IOB pairs in the column being tested. Only one buffer is enabled, or not tri-stated, at a time. All the IOB pairs in the column tested have their differential output terminals shorted to the terminals of a given IOB pair with the internal 100 Ohm resistor. In this manner, each buffer in the column is sequentially tested using the 100 Ohm resistor of the given IOB pair.

BRIEF DESCRIPTION OF THE DRAWINGS

Further details of the present invention are explained with the help of the attached drawings in which.

DETAILED DESCRIPTION

Figure 4:
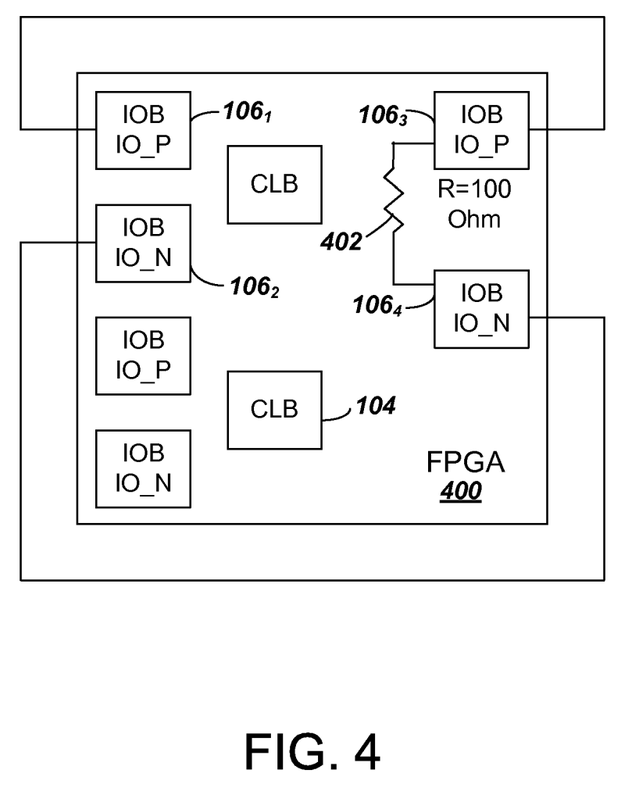
FIG. 4 shows a block diagram of components of an FPGA illustrating how an internal 100 Ohm resistor can be used for differential testing according to embodiments of the present invention.

FIG. 4 shows a block diagram of components of an FPGA 400 illustrating how an internal 100 Ohm resistor 402 can be used for differential testing according to embodiments of the present invention. As shown, the resistor 402 is connected internal to the FPGA 400 across two IOBs $106_3$ and $106_4$. A differential signal to be tested is provided from a pair of IOBs $106_1$ and $106_2$. The IOB $106_1$ provides an IO_P differential output connected through IOB $106_3$ to a first terminal of resistor 402, while IOB $106_2$ provides an IO_N differential output connected through IOB $106_4$ to a second terminal of resistor 402. A CLB, such as 104, can be connected by internal routing lines to provide the differential signal to the IOBs $106_1$ and $106_2$.

Figure 5:
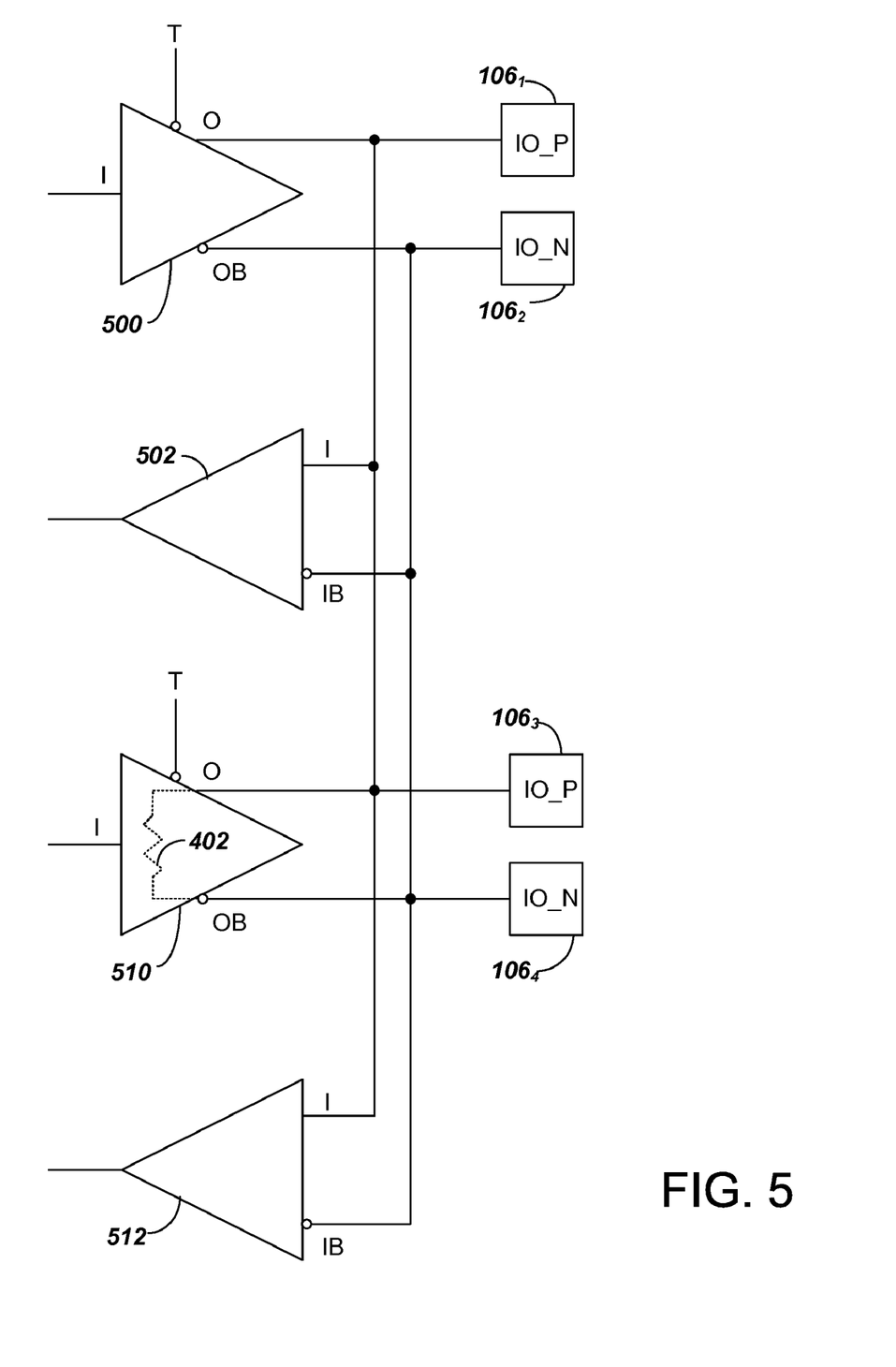
FIG. 5 shows a test configuration for differential testing of IOBs according to embodiments of the present invention.

FIG. 5 shows how the resistor 402 of FIG. 4 can be the internal resistor of a buffer 510 that provides a differential signal that is otherwise available in an FPGA. That is, in some embodiments a buffer may include an internal resistor, for example to support a differential standard, and that internal resistor may be used during testing. This has a benefit of not requiring extra area to support testing features. In other embodiments, an internal resistor can be added. The test configuration shown, thus, includes a first buffer 500 to be tested and a second buffer 510. The second buffer 510 includes the internal resistor 402 that is used in place of the external resistor 204 of FIG. 2.

Connection of differential outputs of the first buffer 500 is provided to the IOB pair $106_1$ and $106_2$. The connection of differential outputs of the second buffer 510 is then provided to the IOB pair $106_3$ and $106_4$. The IOB IO_P contact $106_1$ is connected (or shorted) to the IOB IO_P contact $106_3$. The IOB IO_N contact $106_2$ is connected (or shorted) to the IOB IO_N contact $106_4$. The internal resistor 402 of buffer 510 is, thus, effectively connected across the differential outputs IO_P $106_3$ and IO_N $106_4$ of buffer 500. The regions labeled IO_P $106_3$ and IO_N $106_4$, respectively, can represent pad regions on a die that can be wire bonded to pins of a chip. Alternatively, IO_P $106_3$ and IO_N $106_4$ terminal can connect to an RF link or other terminal connection. Interconnection of the regions $106_3$-$106_4$ can be accomplished, for example, in a programmable logic device, such as an FPGA, by programming interconnect points by loading a test configuration program into the configuration memory of the FPGA.

Similar to the buffers 200 and 202 of FIG. 2, the circuit of FIG. 5 includes the output buffer 500 and a corresponding input buffer 502. The buffer 500 receives an input signal (I) from components internal to the integrated circuit, such as a CLB or IOB, or components external to the chip. The output buffer 500 then provides a differential output to the pair of terminals $106_1$ and $106_2$, the differential output including a first signal (O) and a second signal (OB) complementary to the first. The input buffer 502 likewise receives a differential input from terminals $106_1$ and $106_2$. The differential input includes a first signal (I) and a second signal (IB) complementary to the first. The input buffer 502 can provide a feedback signal from the output of buffer 500, or provide a signal from an external device that is provided to terminals $106_1$ and $106_2$.

The input buffer 510 includes the internal resistor 402. In some embodiments of the present invention, the resistor 402 is built-in only in IOBs of an IC with a special differential termination (DT). Thus, the buffer 500 is not shown with such a resistor. The DT type IOBs, thus, serve to test other IOBs in the IC.

During testing, the input signal (I) is applied to the buffer 500. The input signal I can come from an internal component of an IC, such as a CLB or an IOB, or external signal applied to a pin of the IC. Differential output signals (O) and (OB) are measured from the terminals $106_1$ and $106_2$. The IC is internally programmed to interconnect or short the differential IO_P terminals $106_1$ and $106_3$, as well as to short the differential IO_N terminals $106_2$ and $106_4$. The resistor 402, thus, provides the differential connection across terminals $106_1$ and $106_2$. When a logic 1 is applied to input I, the outputs O and OB are expected to be a high and a low respectively. When a logic 0 is applied to input I, outputs O and OB are expected to provide a low and a high respectively.

Figure 6:
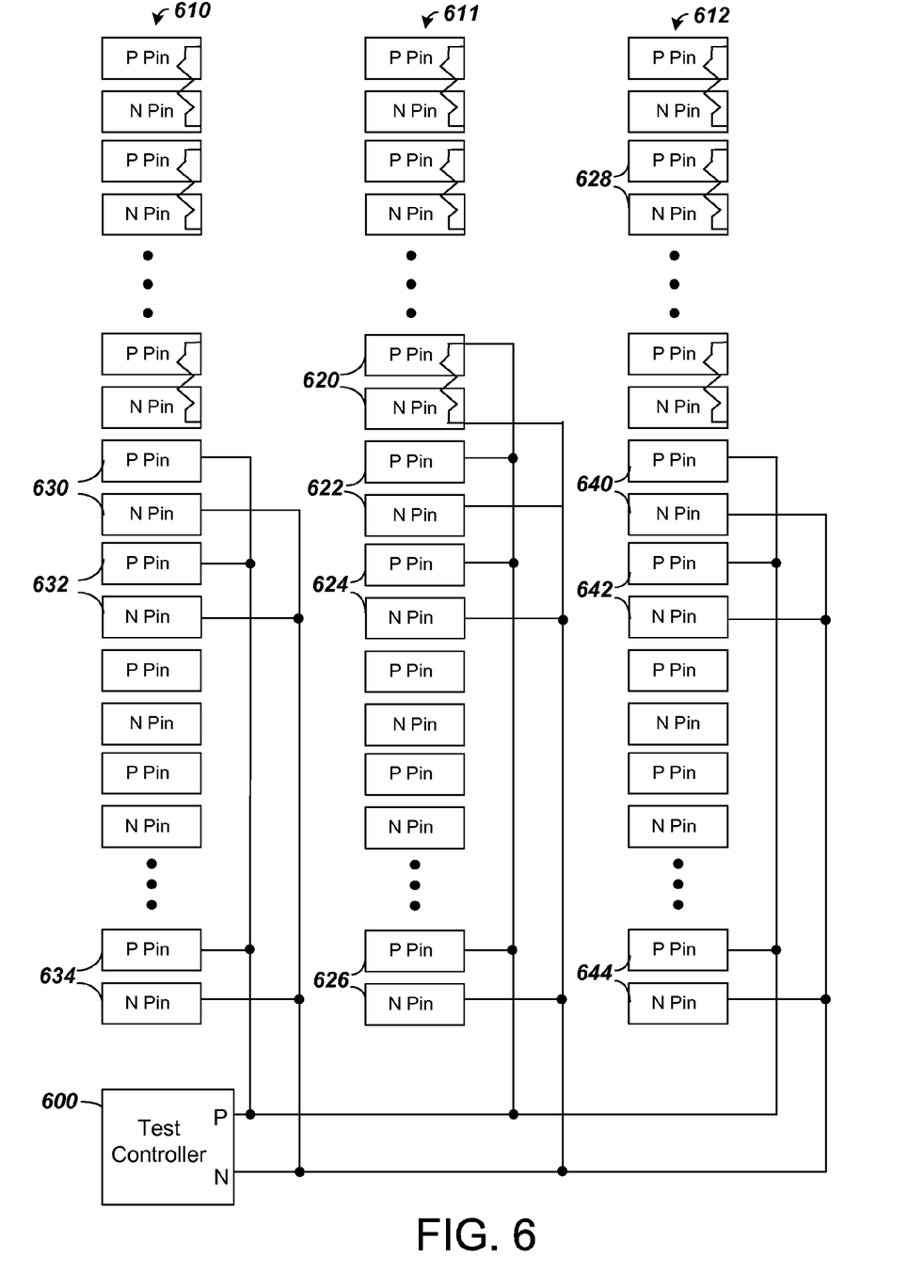
FIG. 6 illustrates connection of a test controller to receive test signals from differential terminals of IOBs of an IC to perform differential signal testing according to embodiments of the present invention.

FIG. 6 illustrates connection of a test controller 600 to receive test signals from differential outputs of IOBs of an IC to perform differential signal testing according to embodiments of the present invention. Only the N Pin and P Pin connections are shown, with other components of the IOBs being illustrated in FIG. 5. One N Pin/P Pin pair 620 connected to the controller 600 includes an internal resistor to function similar to the resistor 402 of buffer 510 of FIG. 5. The remaining N Pin/P Pin pairs 622, 624, 626, 630, 632, 634, 640, 642 and 644 are connected to the test controller 600 and can function to test buffers like the IOBs $106_1$ and $106_2$ used to test buffer 500 in FIG. 5. With the test controller 600 connected to only one P Pin/N Pin pair 620 that has an internal resistor, a test signal must be applied to each of the IOB pairs 622, 624, 626, 630, 632, 634, 640, 642 and 644 individually with the others tri-stated (or otherwise disconnected) to perform testing.

In an alternative test configuration, other P Pin/N Pin pairs than 620 with internal resistors, such as pair 628, are utilized to enable testing of more than one IOB at a time. In this manner, separate P and N connections are provided from the test controller 600 for each IOB pair that is tested. In one embodiment, with the IOBs divided into columns, entire columns can be tested by connecting each column of IOB pairs with separate IOB pairs having 100 Ohm internal resistors, and receiving a separate signal from each pair using the test controller.

Figure 7:
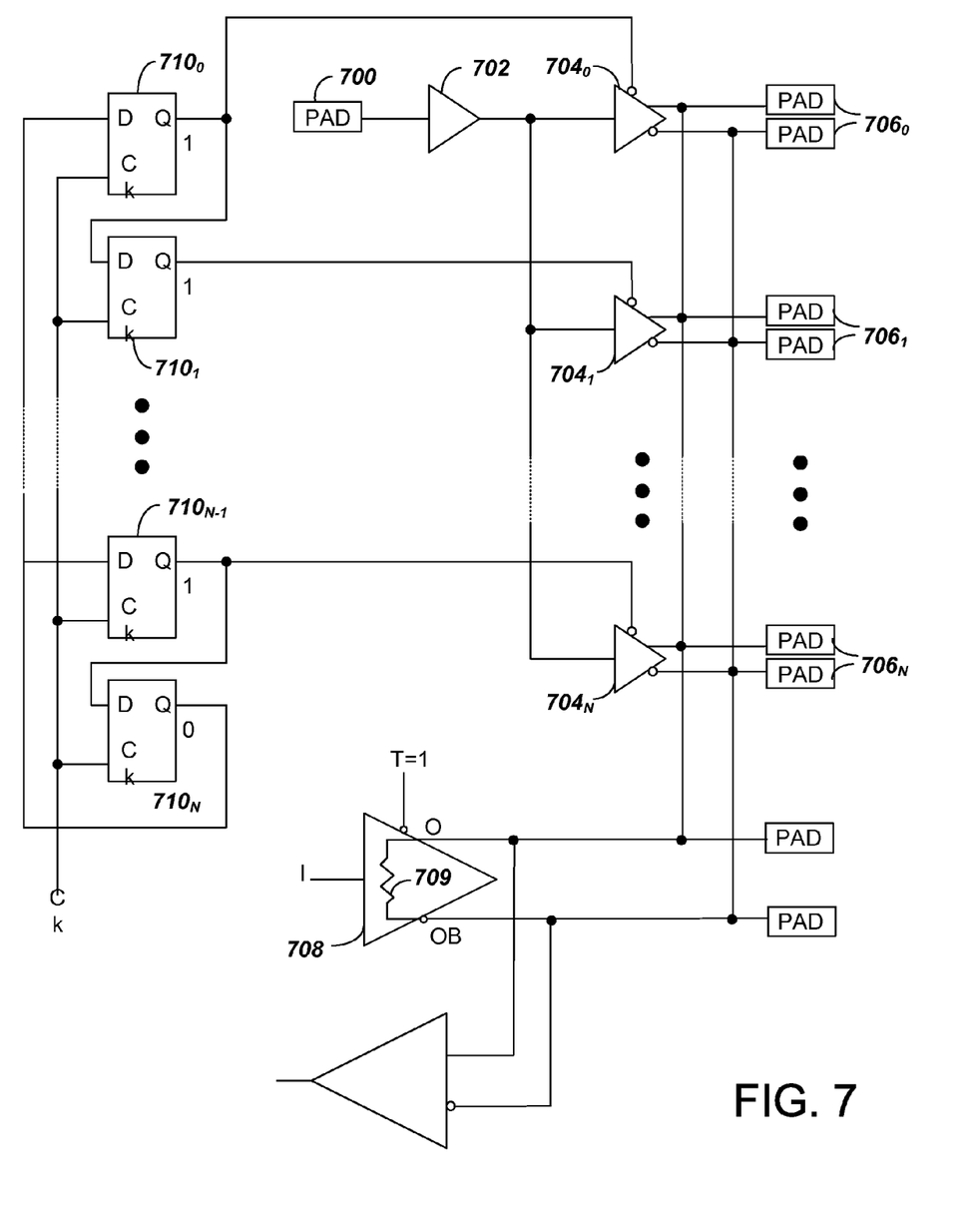
FIG. 7 illustrates a connection of registers and IOBs to sequentially connect and test IOBs one at a time according to embodiments of the present invention.

FIG. 7 illustrates a connection of registers and IOBs to sequentially connect and test IOB pairs one at a time according to embodiments of the present invention. The system of FIG. 7 includes a buffer 708 with a built in resistor 709, similar to the resistor 402 of FIG. 5. Further, the test system includes buffers $704_0$-$704_N$ with differential outputs that are to be tested sequentially, one at a time. Test signals can be measured from the buffers $704_0$-$704_N$ via the pads of respective IOB pairs $706_0$-$706_N$. An input test signal to the buffers $704_0$-$704_N$ is shown provided from a pad through buffer 702.

The test system of FIG. 7 further includes a series of interconnected registers $710_0$-$710_N$ that form a shift register to supply tri-state signals to the buffers $704_0$-$704_N$ being tested. The tri-state signals are shown to be a 1 for all but one buffer in the buffers $704_0$-$704_N$, enabling only one buffer differential output to be connected to the resistor 709 for testing at a time with the test signal from buffer 702. The differential outputs from buffers $704_0$-$704_N$ are tested each cycle of the clock signal (Ck) applied to the registers $710_0$-$710_N$.

Although the present invention has been described above with particularity, this was merely to teach one of ordinary skill in the art how to make and use the invention. Many additional modifications will fall within the scope of the invention, as that scope is defined by the following claims.

What is claimed is:

1. A method for differential testing of input/output block (IOB) pairs of an integrated circuit (IC) comprising:
    connecting a first terminal of a first differential IOB pair to a first terminal of a second differential IOB pair;
    connecting a second terminal of the first differential IOB pair to a second terminal of the second differential pair, wherein a resistor is provided between the first and the second terminal of the second differential IOB pair within the integrated circuit;
    providing a first test signal to a first buffer having outputs connected to the first terminal and the second terminal of the first differential IOB pair; and
    measuring a differential output between the first output terminal and the second output terminal of the first buffer.

2. The method of claim 1,
    wherein the integrated circuit comprises a Programmable Logic Device (PLD),
    wherein the connection of the first terminal of the first differential IOB pair with the first terminal of the second differential IOB pair is made by programming configuration logic of the PLD, and
    wherein the connection of the second terminal of the first differential IOB pair with the second terminal of the second differential IOB pair is made by programming configuration logic of the PLD.

3. The method of claim 1, wherein the resistor is provided in a second buffer, the method further comprising:
    tri-stating the first and second differential outputs of the first buffer;
    connecting the first terminal of the second differential IOB pair with a first terminal of a third differential IOB pair;
    connecting a second terminal of the second differential IOB pair with a second terminal of the third differential IOB pair, wherein a third buffer is connected to provide a differential output to the first and second terminals of the third differential IOB pair;
    providing a second test signal to an input of the third buffer; and
    measuring a differential output between the first terminal and the second terminal of the third IOB pair.

4. The method of claim 1,
    wherein the step of connecting the first terminal of the first differential IOB pair comprises connecting a first terminal of each of a first group of IOB pairs, including the first IOB pair, with the first terminal of each of a second group of IOBs, including the second IOB pair,
    wherein the step of connecting a second terminal of the first differential IOB pair comprises connecting a second terminal of each of a first group of IOB pairs, including the first IOB pair, with the second terminal of each of a second group of IOBs, including the second IOB,
    wherein the step of providing the test signal further comprises providing the first test signal to an input of each buffer in a first group of buffers having outputs connected to the first and second terminals of the first group of differential IOB pairs, and
    wherein measuring a differential output further comprises measuring between the first terminal and the second terminal of each of the first and second terminals of the first group of differential IOB pairs.

5. The method of claim 1, wherein the IC comprises a Field Programmable Gate Array (FPGA).

6. An integrated circuit (IC) provided in a test configuration for testing differential outputs provided from buffers in the IC, the IC comprising:
    a first buffer having an input terminal for receiving a test signal, a first differential output terminal for providing a first differential result of the test signal and a second differential output terminal for providing a second differential result of the test signal; and
    a second buffer having a first differential output terminal connected to the first differential output terminal of the first buffer, and a second differential output terminal connected to the second differential output terminal of the first buffer, wherein a resistor is provided between the first and the second output of the second buffer within the IC.

7. The IC of claim 6, wherein the IC comprises a Field Programmable Gate Array (FPGA).

8. The IC of claim 6, wherein the first buffer and the second buffer provide reference voltages.

9. The IC of claim 6, wherein the resistor is approximately 100 Ohms.

10. The IC of claim 6, further comprising:
    additional buffers, each having a first differential output terminal connected to the first differential output terminal of the second buffer, and a second differential output terminal connected to the second differential output of the second buffer; and
    registers connected to tri-state inputs of the additional buffers and the first buffer, the registers configured to provide an output to tristate the additional buffers, while enabling the output of the first buffer during testing of the first buffer.

11. The IC of claim 6,
    wherein the IC includes programmable logic, and
    wherein the first differential output terminal of the second buffer is connected to the first differential output terminal of the first buffer by the programmable logic, and
    wherein the second differential output terminal of the second buffer is connected to the second differential output terminal of the first buffer by the programmable logic.

12. An integrated circuit (IC) provided in a test configuration for testing input/output block (IOB) pairs providing differential outputs in the integrated circuit, the integrated circuit comprising:

a first plurality of IOB pairs each having a first differential output terminal for measuring a first portion of a differential test signal and a second differential output terminal for measuring a second differential test signal; and a second plurality of IOB pairs, each having a first differential output terminal connected to the first differential output terminal of a given one of the first plurality of IOB pairs, and a second differential output terminal connected to the second differential output terminal of the given one of the second plurality of IOB pairs, wherein a resistor internal to the IC is provided between the first and the second differential output terminal of each of the second IOB pairs.

13. The IC of claim 12, wherein the first plurality of IOB pairs is provided in a first column of successive IOBs in the IC and the second plurality of IOB pairs is provided in a second column of successive IOBs in the IC.

14. The IC of claim 12, wherein the IC comprises a Field Programmable Gate Array (FPGA).

15. The IC of claim 12, wherein the resistors provided between the first and the second differential output terminal of each of the second IOB pairs is approximately 100 Ohms.

16. The IC of claim 12, wherein the IC includes programmable logic, and wherein the first differential output terminal of each of the second plurality of IOB pairs is connected to the first differential output terminal of a given one of the first plurality of IOB pairs by the programmable logic, and wherein the second differential output terminal of each of the second plurality of IOB pairs is connected to the second differential output terminal of the given one of the second plurality of IOB pairs by the programmable logic.

* * * * *